(12) United States Patent
Kraus

(10) Patent No.: US 8,157,418 B2
(45) Date of Patent: Apr. 17, 2012

(54) ILLUMINATION DEVICE COMPRISING A HEAT SINK

(75) Inventor: Robert Kraus, Regensburg (DE)

(73) Assignee: Osram AG, Munich (DE)

( * ) Notice: Subject to any disclaimer, the term of this patent is extended or adjusted under 35 U.S.C. 154(b) by 189 days.

(21) Appl. No.: 12/290,807

(22) Filed: Nov. 4, 2008

(65) Prior Publication Data
US 2009/0129076 A1    May 21, 2009

(30) Foreign Application Priority Data
Nov. 19, 2007   (DE) .......................... 10 2007 055 133

(51) Int. Cl.
*F21V 29/00*    (2006.01)
(52) U.S. Cl. .................... 362/294; 362/373; 362/249.04
(58) Field of Classification Search .................. 362/294, 362/373, 249.02, 249.04
See application file for complete search history.

(56) References Cited

U.S. PATENT DOCUMENTS

| | | | |
|---|---|---|---|
| 6,498,355 B1 * | 12/2002 | Harrah et al. ................... | 257/99 |
| 6,936,855 B1 * | 8/2005 | Harrah ............................ | 257/88 |
| 7,303,315 B2 * | 12/2007 | Ouderkirk et al. ............ | 362/294 |
| 7,335,926 B2 * | 2/2008 | Wang et al. ...................... | 257/99 |
| 7,505,109 B2 * | 3/2009 | Cheng et al. ................... | 349/161 |
| 7,625,104 B2 * | 12/2009 | Zhang et al. ................... | 362/294 |
| 7,708,427 B2 * | 5/2010 | Baroky et al. ................. | 362/238 |
| 7,932,969 B2 * | 4/2011 | Hong ................................ | 349/69 |
| 2003/0189830 A1 * | 10/2003 | Sugimoto et al. ............. | 362/294 |
| 2004/0065894 A1 * | 4/2004 | Hashimoto et al. .......... | 257/100 |
| 2009/0207630 A1 * | 8/2009 | Satoh et al. ................... | 362/615 |

FOREIGN PATENT DOCUMENTS

WO    WO 2005/001943 A1    1/2005

* cited by examiner

*Primary Examiner* — Peggy A. Neils
(74) *Attorney, Agent, or Firm* — Holtz, Holtz, Goodman & Chick, PC

(57) ABSTRACT

The invention relates to an illumination device (1) comprising at least one substrate plate (2), at least two light-emitting diodes (3) (LEDs) arranged on the same side (A) of the substrate plate (2), and at least one electrically conductive cooling device (8) arranged on the opposite side (B) of the substrate plate (2), in particular a metallic heat sink (8), wherein at least two LEDs (3) are thermally operatively connected to the cooling device (8) by means of in each case at least one thermal coupling device (9) formed from an electrically conductive material. According to the invention, the cooling device (8) has at least two regions (8a, 8b, 8c) which are electrically isolated from one another, wherein a first region (8b) is thermally and electrically operatively connected to at least one first LED (3), and a second region (8a, 8c) is thermally and electrically operatively connected to at least one second LED (3).

18 Claims, 2 Drawing Sheets

ILLUMINATION DEVICE COMPRISING A HEAT SINK

TECHNICAL FIELD

The invention relates to an illumination device comprising at least one substrate plate, at least two light-emitting diodes (LEDs) arranged on the same side of the substrate plate, and at least one electrically conductive cooling device arranged on the opposite side of the substrate plate, in particular a metallic heat sink, wherein at least two LEDs are thermally operatively connected to the cooling device by means of in each case at least one thermal coupling device formed from an electrically conductive material.

PRIOR ART

Illumination devices using light emitting diodes (LEDs) for generating light often have a substrate plate with one or a plurality of LEDs arranged on one side (front side) thereof. The LEDs are connected to one another or to an electronic control unit by means of conductive tracks.

Modern high-power LEDs generate considerable amounts of heat in a very small space, and these amounts of heat have to be reliably dissipated in order that the properties of the LED, in particular the lifetime, are not adversely influenced. For this purpose, it is customary to arrange on the opposite side (rear side) of the substrate plate to the LED a cooling device, for example a heat sink, which is thermally operatively connected to the LED by means of one or a plurality of thermal coupling devices (e.g. so-called vias).

Since materials having good electrical conductivity, in particular metals, also have a high thermal conductivity, the components used for dissipating heat from the LEDs are usually produced from an electrically conductive material, in particular from metal or a metal alloy.

If a plurality of LEDs are arranged on a substrate plate, for example in order to increase the luminous intensity or to set the color temperature by using different-colored LEDs, a common heat sink is usually arranged on the rear side of the substrate plate, said common heat sink being thermally operatively connected to all the LEDs. Said heat sink often covers a large part of the rear side of the substrate plate and can thus be used for additional mechanical stabilization of the substrate plate.

Depending on the application, for example if LEDs are intended to be driven independently of one another, individual LEDs can have different voltages applied to them. In order to make this possible, the individual LEDs and also the power supply lines to the LEDs have to be electrically isolated from the heat sink.

As shown in WO 2005/001943, for this purpose for example the heat sink can be fixed to the underside of the substrate plate by means of an electrically insulating adhesive layer, or alternatively an insulation element can be provided between the LEDs or the power supply lines thereof and the devices for thermally coupling the LEDs to the heat sink.

What is disadvantageous about an arrangement of this type, however, is the considerably impaired heat conduction—owing to the electrically insulating components—between LED and heat sink and also the high production outlay owing to the application of the insulation layers.

SUMMARY OF THE INVENTION

It is an object of the present invention, therefore, to provide an illumination device in accordance with the preamble of claim 1 which is simple to produce and enables efficient dissipation of heat from the LEDs.

This object is achieved by means of the characterizing features of claim 1.

Particularly advantageous configurations are found in the dependent claims.

By virtue of the fact that the cooling device has at least two regions which are electrically isolated from one another, wherein a first region is thermally and electrically operatively connected to at least one first LED, and a second region is thermally and electrically operatively connected to at least one second LED, a simple and cost-effective construction is obtained since, by dispensing with an electrical insulation between the light emitting diodes and the cooling device, it is possible to obtain a particularly good thermal linking and the process steps for applying the insulating layers are obviated.

Furthermore, it is advantageous if at least one region of the cooling device and at least one device for thermally coupling at least one LED to the cooling device are embodied in one piece. This enables the illumination device to be assembled particularly simply, rapidly and securely since both devices can be connected to the substrate plate in a common work step. Moreover, a particularly good heat conduction from the thermal coupling device toward the cooling device is achieved since there are no transitions between separate components.

It is likewise advantageous if at least one mechanical connecting element is arranged between at least two regions of the cooling device which are electrically isolated from one another. As a result, the cooling device can furthermore be used for transmitting mechanical forces and thus for stabilizing the substrate plate. Moreover, a mechanically sufficiently stable cooling device is simpler to handle during assembly and in particular can be connected to the substrate plate more simply.

By virtue of the fact that the mechanical connecting element is fitted to at least one of the regions of the cooling device which are electrically isolated from one another, by means of a positively locking connection, in particular a screw connection and/or a plug connection and/or a sliding connection, a particularly good force transmission is ensured. A screw connection enables a particularly fixed connection which can nevertheless also be released again relatively simply. A plug connection enables a connection of the regions which can be produced with little outlay and rapidly, for example by means of holding clips, while a sliding connection, for example by means of a dovetail guide, permits a simple assembly and a certain mobility in one spatial direction, which is advantageous for example for compensating for different thermal expansion of the two connected components.

It is likewise expedient if the mechanical connecting element is fitted to at least one of the regions of the cooling device which are electrically isolated from one another, by means of a force-locking connection, in particular a clamping connection. Force-locking connections, in particular clamping connections, can be produced in a simple manner. Moreover, in the case of these connections it is particularly simple to enable a defined release of the connection when a defined maximum force is exceeded, said defined release preventing important components from being destroyed.

Furthermore, it is expedient if the mechanical connecting element is fitted to at least one of the regions of the cooling device which are electrically isolated from one another, by means of an adhesive bonding connection. Adhesive bonding connections can be produced in a simple manner and the properties, in particular with regard to flexibility and holding power, are readily adaptable to the intended use.

Advantageously, the mechanical connecting element has at least one section formed from a polymer material and serving for electrically insulating the regions of the cooling device which are electrically isolated from one another. Polymer materials are particularly well suited as an insulation element since, alongside a good electrical insulation capability, they can be processed in a simple manner and can be shaped into diverse forms, thereby enabling even complex elements to be produced simply and cost-effectively. As a result, for example connecting elements which are formed practically completely from a polymer material can be used for mechanically connecting the individual regions of the cooling device.

It is likewise advantageous if the mechanical connecting element has at least one section formed from a ceramic material, in particular from aluminum oxide and/or aluminum nitrite and/or zirconium oxide, and serving for electrically insulating the regions of the cooling device which are electrically isolated from one another. Alongside the good electrical insulation capability, ceramic materials afford further outstanding properties, such as high strength and thermal stability. Given a suitable choice, the thermal conductivity can also be higher than that of many polymer materials, thereby ensuring a good thermal transfer between the regions of the cooling device which are electrically isolated from one another, which leads to a more homogeneous temperature distribution within the cooling device.

In a further advantageous embodiment of the invention, the mechanical connecting element has at least one section formed from a glass material and serving for electrically insulating the regions of the cooling device which are electrically isolated from one another. Glass materials afford, in particular, a very good electrical insulation and also a high thermal and chemical resistance.

In a particularly advantageous embodiment of the invention, the mechanical connecting element has at least one section formed from an adhesive and serving for electrically insulating the regions of the cooling device which are electrically isolated from one another, in particular is formed as an adhesive bonding connection. Adhesives can be introduced in liquid form and therefore in a simple manner even into complicated geometries. By virtue of the fact that they can both effect electrical insulation and transmit mechanical forces, there is no need for any independent components for these tasks. Therefore, a particularly simple construction is made possible in which the mechanical connecting element is practically only composed of the adhesive bonding connection.

It is expedient if the side of the substrate plate which faces the cooling device is covered substantially, in particular to more than 70%, preferably to more than 85%, by the cooling device. In this way the cooling device is able not only to develop an outstanding cooling effect but also to contribute to the mechanical stabilization of the substrate plate.

Furthermore, it is advantageous if means for simply subdividing the substrate plate into at least two regions which are electrically insulated from one another are provided. Means of this type, for example desired breaking locations or simply releasable connecting elements, make it possible for the cooling device firstly to be applied to the substrate plate in a relatively simple manner as a continuous component and only afterward be divided into regions which are electrically isolated from one another. For different variants of substrate plates with different arrangements and/or interconnections of the LEDs, it is thus possible to use a uniform version of the cooling device and to obtain the electrical insulation effect for individual regions as required.

In one advantageous development of the invention at least two LEDs arranged on the illumination device are thermally operatively connected to a common region of the cooling device. If the LEDs are arranged in terms of circuitry such that the same potential is always applied to them, the outlay for an electrical isolation of the assigned regions of the cooling device can be omitted and the production of the illumination device can be simplified.

In one advantageous development of the invention, each of the LEDs arranged on the illumination device is respectively thermally operatively connected to a region of the cooling device and all the regions of the cooling device which are respectively operatively connected to an LED are in each case electrically isolated from one another. As a result, a different potential can be applied to all the LEDs independently of one another.

Advantageously, the substrate plate is embodied as a flexible substrate plate. As a result, departing from a planar arrangement, the substrate plate can also assume more complex geometries and be adapted to possibly special installation conditions. By virtue of the segmentation of the cooling device, the cooling device is also flexibly adaptable thereto.

It is advantageous if the method for producing the illumination device comprises the following steps: in a first step, the cooling device is applied to the substrate plate and, in a second step, the cooling device is subdivided into regions which are electrically insulated from one another. Depending on the further boundary conditions during production, it is possible to carry out application of other elements to the substrate plate, in particular of the conductor tracks and the LEDs, before or after these steps. What is advantageous about this method is that the cooling device is applied to the substrate plate in one piece and therefore also in one method step, which is significantly simpler to realize than the application of a multiplicity of cooling devices which are electrically insulated from one another. The subsequent separation of the cooling device can be performed by means of simple means, particularly if this is already taken into account in the configuration of the cooling device, for example by using desired breaking locations.

BRIEF DESCRIPTION OF THE DRAWING DRAWINGS

The invention will be explained in more detail below on the Basis of an exemplary embodiment.

PREFERRED EMBODIMENT OF THE INVENTION

Figure 1:
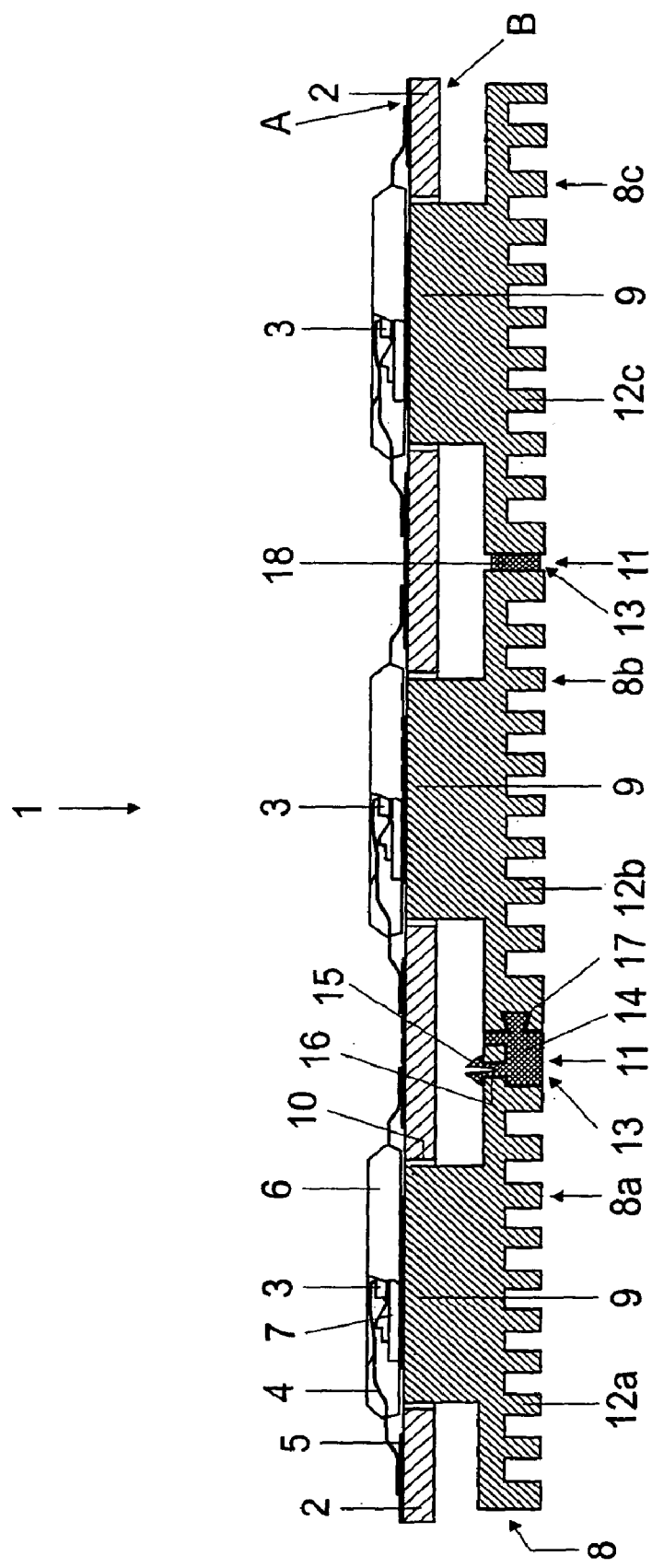
FIG. 1 shows an illumination device according to the invention in a lateral sectional view illustration.

The illumination device 1 according to the invention essentially comprises a substrate plate 2, with three light emitting diodes 3 (LEDs) arranged on one side A (front side), thereof. Said diodes are known in many different embodiments which, in particular, in each case also emit electromagnetic radiation in different wavelengths ranging essentially from infrared through visible light to the ultraviolet region of the spectrum. The LEDs 3 are connected by means of power supply wires 4 to conductor tracks 5 likewise arranged on the front side A of the substrate plate 2. For protection against ambient influences, the LEDs 3 are each embedded into a housing 6. In order to dissipate the waste heat of the LEDs 3, the latter are in each case arranged on a so-called heat slug 7, which, on that side of the housing 6 which is assigned to the substrate plate 2, simultaneously serves as a termination of the housing 6. The heat slug 7 is accordingly produced from a material having good thermal conductivity, usually copper or aluminum.

A cooling device 8 is arranged on that side B (rear side) of the substrate plate 2 which is remote from the LEDs 3, said cooling device, in terms of its basic construction, being embodied very simply as a passive heat sink. The cooling device 8 is thermally operatively connected to the LEDs 3 by means of thermal coupling devices 9, which, in the present exemplary embodiment, comprise thermal feedthroughs 9 in the substrate plate 2. The thermal feedthroughs 9 are each arranged in a hole 10 in the substrate plate 2, wherein the dimensions of the holes 10 are only slightly smaller than those of the base area of the housing 6 of the LED 3. In the present exemplary embodiment, the holes 10 and therefore also the thermal feedthroughs 9 have a circular cross-sectional area, but any other forms are also possible.

The cooling device 8 is subdivided by joints 11 into individual regions 8a, 8b, 8c that are respectively assigned to an LED 3. In this case, each of said regions 8a, 8b, 8c respectively comprises an individual cooling segment 12a, 12b, 12c and a thermal feedthrough 9 assigned to an LED 3. The respective cooling segment 12a, 12b, 12c and the thermal feedthrough 9 assigned to it are embodied in one piece, which enables a particularly good heat conduction and also a simple production of the components. Aluminum is used as a material for this, owing to the good heat conduction, simple processability and the relatively low costs. The cooling segments 12a, 12b, 12c are connected to one another by means of connecting elements 13.

A first possibility of insulating regions 8a, 8b, 8c of the cooling device 8 from one another is shown at the left-hand one of the two joints 11. A connecting bridge 14 produced from plastic is fixed as a mechanical connecting element 13 in the cooling segment 8a by means of a holding pin 15 integrally formed onto the connecting bridge 14. Only one holding pin 15 is shown for reasons of clarity; it goes without saying that the number should be chosen so as to ensure the desired stability of the connection. The holding pin 15 is configured such that it is held in a hole 16 in the segment 12a by means of a clip connection, wherein the stepped configuration of the segment 12a in this region additionally supports the transmission of mechanical forces. In the opposite segment 12b, the connecting bridge 14 is fixed by means of a dovetail guide, wherein, in the present exemplary embodiment, the dovetail 17 is part of the connecting bridge 14, while the dovetail groove 18 is worked into the segment 12b. It goes without saying that an arrangement the other way round is also conceivable.

A further possibility of insulating regions 8a, 8b, 8c of the cooling device 8 from one another is shown at the right-hand one of the two joints 11, which is filled with an adhesive 18. The adhesive 18 between the regions 8b and 8c of the cooling device 8 acts both as a mechanical connecting element 13 for mechanically connecting the regions 8b and 8c to one another and for electrical insulation of the regions 8b and 8c from one another. Therefore, each LED 3 is respectively assigned a region 8a, 8b, 8c of the cooling device 8 which is electrically isolated from the other regions 8a, 8b, 8c assigned to other LEDs 3.

Figure 2:
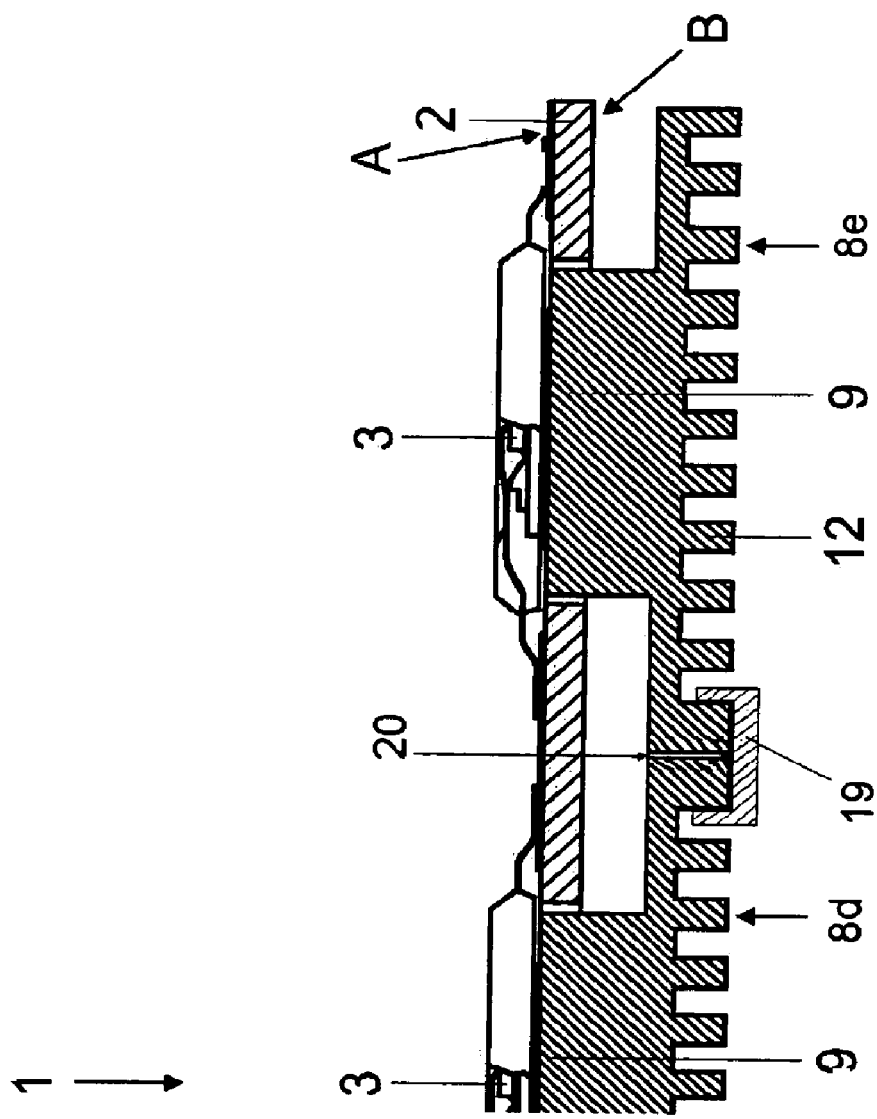
FIG. 2 shows an embodiment of FIG. 1 using a clamping device 19.

As shown in FIG. 2, a clamping device 19 can be used to bridge the gap 20 between two regions 8d, 8e.

In the present exemplary embodiment, the adhesive 18 is produced on the basis of epoxy resin, whereby the requirements necessary with regard to electrical insulation capability, mechanical strength and processability are satisfied.

Through a suitable choice of the adhesive 18, in particular with regard to the mechanical properties, it is however also possible, for example, when using suitable flexible substrate plates, so-called flexboards, to bend within certain limits the combination of flexboard and cooling device 8 after the latter have been joined together, and thus to enable deviations from the planar geometry in a simple way. Depending on the intended use, it may also be desirable to use an adhesive 18 having a good thermal conductivity in order to obtain a temperature distribution that is relatively homogeneous over the entire cooling device 8. It may also be desirable, however, for the regions 8a, 8b, 8c assigned to individual LEDs 3 to be thermally insulated from one another as well as possible.

The cooling device 8 covers more than 75% of the area of the substrate plate 2 and, given suitably fixed linking to the substrate plate 2, enables a mechanically stiff construction of the illumination device 1, which facilitates the handling thereof and makes it less sensitive in particular toward mechanical stresses.

It goes without saying that other embodiments of the invention are also conceivable. In particular, instead of the one shown, it is also possible to use any other type of electrically insulating mechanical connection in order to connect the cooling segments 12 of the cooling device 8 to one another. A number of possibilities for producing such a connection are known to the person skilled in the art. By way of example, a different form than the form of the latching-in plug connections shown could be used. Screw connections are also conceivable in which the connecting bridges 13 are screwed to one or both segments 12 involved. Tongue-and-groove systems can also be regarded as plug connections. It goes without saying that the connecting bridges 13 can also be integrally formed onto the individual segments 13 and be electrically isolated from one another for example by elements that are inserted, pushed in or applied in some other way and are composed of an insulating material. Thus, by way of example, individual segments 12 can partially overlap and, with an insulation element inserted, be connected, for example screwed or riveted, to one another in a simple manner.

Any suitable electrically insulating material, such as, for example, thermoset or thermoplastic polymer materials, ceramic materials such as, for example, $Al_2O_3$, $ZrO_2$ or AlN or else glasses, can be used as insulating material between the segments 12 depending on the requirements made of the properties, in particular thermal and electrical conductivity and also mechanical strength. In this case, the mechanical connecting elements 13 can be formed completely from insulating material or alternatively just have an insulating section. The latter can in particular also be embodied as a film or coating.

The thermal feedthroughs 9 can also comprise a plurality of elements, in particular for example a plurality of individual so-called vias, that is to say circular feedthroughs composed of metal with a relatively small diameter. Instead of aluminum, other materials or material composites having a high thermal conductivity, such as, for example, copper or carbon nanotubes, can be used both for the thermal feedthroughs 9 and for the segments 12 of the cooling device 8.

The substrate plate 2 can likewise be produced from any material or material composite suitable for such applications, in particular from polymer materials and ceramics such as $Al_2O_3$ or AlN.

It goes without saying that it is also conceivable for a region of the substrate plate 2 to be assigned more than one light emitting diode 3 if the latter are continuously at the same potential level by virtue of a parallel connection.

For some applications it may also be of interest for the mechanical connections 13, 18 between the segments 12 to be released again after the cooling device 8 has been applied to the substrate plate 2. The cooling device 8 is then connected as an individual component to the substrate plate 2 and the connecting elements 13, 18 between the segments 12 of the cooling device 8 are subsequently released again. This can be realized for example by the cooling device 8 being produced from one piece and being segmented along desired breaking locations after assembly. Adhesive bonding connections 18 can for example also be completely or partly removed by thermal treatment or by means of a chemical solvent and mechanical connecting bridges 13 can for example be pulled off or severed. The mechanical stresses that otherwise arise in the case of an undivided cooling device 8 as a result of different thermal expansion of the segments 12 can thus be prevented and, when using a flexible substrate plate 2, it is also possible to realize narrow radii of curvature and complex geometries. Instead of a passive cooling device 8 composed of solid segments 12, it goes without saying that other cooling devices according to the prior art are also conceivable, for example those with active elements, such as fans, for example, or with cooling channels which are worked in and through which air or else a suitable liquid flows.

The invention claimed is:

1. An illumination device (1) comprising at least one substrate plate (2), at least two light-emitting diodes (3) (LEDs) arranged on the same side (A) of the substrate plate (2), the LEDs (3) are each embedded into a housing (6) placed on the substrate plate in order to dissipate waste heat of the LEDs (3), and at least one electrically conductive cooling device (8) arranged on the opposite side (B) of the substrate plate (2) wherein at least two LEDs (3) are thermally operatively connected to the cooling device (8) by means of in each case at least one thermal coupling device (9) formed from an electrically conductive material,
characterized in that the cooling device (8) has at least two regions (8a, 8b, 8c) which are electrically isolated from one another, wherein a first region (8b) is thermally and electrically operatively connected to at least one first LED (3), and a second region (8a, 8c) is thermally and electrically operatively connected to at least one second LED (3) and
characterized in that at least one mechanical connecting element (13) is arranged between at least two regions (8a, 8b, 8c) of the cooling device (8) while maintaining the at least two regions electrically isolated from one another.

2. The illumination device (1) as claimed in claim 1, characterized in that at least one region (8a, 8b, 8c) of the cooling device (8) and at least one device (9) for thermally coupling at least one LED (3) to the cooling device (8) are embodied in one piece.

3. The illumination device (1) as claimed in claim 1, characterized in that the mechanical connecting element (13) is fitted to at least one of the regions (8a, 8b, 8c) of the cooling device (8) which are electrically isolated from one another, by means of a positively locking connection.

4. The illumination device (1) as claimed in claim 1, characterized in that the mechanical connecting element (13) is fitted to at least one of the regions (8a, 9b, 8c) of the cooling device (8) which are electrically isolated from one another, by means of a force-locking connection.

5. The illumination device (1) as claimed in claim 1, characterized in that the mechanical connecting element (13) is fitted to at least one of the regions (8a, 8b, 8c) of the cooling device (8) which are electrically isolated from one another, by means of an adhesive bonding connection (18).

6. The illumination device (1) as claimed in claim 1, characterized in that the mechanical connecting element (13) has at least one section (14, 18) formed from a polymer material and serving for electrically insulating the regions (8a, 8b, 8c) of the cooling device (8) which are electrically isolated from one another.

7. The illumination device (1) as claimed in claim 1, characterized in that the mechanical connecting element (13) has at least one section formed from a ceramic material, and serving for electrically insulating the regions (8a, 8b, 8c) of the cooling device (8) which are electrically isolated from one another.

8. The illumination device (1) as claimed in claim 1, characterized in that the mechanical connecting element (13) has at least one section formed from a glass material and serving for electrically insulating the regions (8a, 8b, 8c) of the cooling device (8) which are electrically isolated from one another.

9. The illumination device (1) as claimed in claim 1, characterized in that the mechanical connecting element (13) has at least one section (18) formed from an adhesive (18) and serving for electrically insulating the regions (8a, 8b, 8c) of the cooling device (8) which are electrically isolated from one another, in particular is formed as an adhesive bonding connection (18).

10. The illumination device (1) as claimed in claim 1, characterized in that the side (B) of the substrate plate (2) which faces the cooling device (8) is covered substantially, in particular to more than 70%, by the cooling device (8).

11. The illumination device (1) as claimed in claim 1, characterized in that means (13, 18) for simply subdividing the substrate plate (2) into at least two regions (8a, 8b, 8c) which are electrically insulated from one another are provided.

12. The illumination device (1) as claimed in claim 1, characterized in that at least two LEDs (3) arranged on the illumination device (1) are thermally operatively connected to a common region (8a, 8b, 8c) of the cooling device (8).

13. The illumination device (1) as claimed in claim 1, characterized in that each of the LEDs (3) arranged on the illumination device (1) is respectively thermally operatively connected to a region (8a, 8b, 8c) of the cooling device (8) and all the regions (8a, 8b, 8c) of the cooling device (8) which are respectively operatively connected to an LED (3) are in each case electrically isolated from one another.

14. The illumination device (1) as claimed in claim 1, characterized in that the substrate plate (2) is embodied as a flexible substrate plate (2).

15. The illumination device (1) as claimed in claim 3, wherein the positively locking connection is at least one of a screw connection, a plug connection and a sliding connection.

16. The illumination, device (1) as claimed in claim 7, wherein the ceramic material is at least one of aluminum oxide, aluminum nitrite and zirconium oxide.

17. The illumination device (1) as claimed in claim 1, wherein the conductive cooling device is a metallic heat sink.

18. The illumination device (1) as claimed in claim 4, wherein the force locking connection is a clamping connection (19).

* * * * *

UNITED STATES PATENT AND TRADEMARK OFFICE
CERTIFICATE OF CORRECTION

PATENT NO. : 8,157,418 B2
APPLICATION NO. : 12/290807
DATED : April 17, 2012
INVENTOR(S) : Robert Kraus Page 1 of 1

It is certified that error appears in the above-identified patent and that said Letters Patent is hereby corrected as shown below:

In Column 7, line 63 (claim 4, line 3),
change "(8a, 9b, 8c)" to --(8a, 8b, 8c)--.

Signed and Sealed this
Sixteenth Day of October, 2012

David J. Kappos
*Director of the United States Patent and Trademark Office*